United States Patent
Labitzke et al.

(10) Patent No.: US 9,875,874 B2
(45) Date of Patent: Jan. 23, 2018

(54) APPARATUS FOR SUPPRESSION OF ARCS IN AN ELECTRON BEAM GENERATOR

(71) Applicant: Fraunhofer-Gesellschaft zur Förderung der angewandten Forschung e.V., Munich (DE)

(72) Inventors: Rainer Labitzke, Dresden (DE);
Severin Dominok, Dresden (DE);
Gösta Mattausch, Ullersdorf (DE);
Stefan Weiss, Dresden (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 15/341,699

(22) Filed: Nov. 2, 2016

(65) Prior Publication Data
US 2017/0133191 A1    May 11, 2017

(30) Foreign Application Priority Data
Nov. 11, 2015  (DE) .......................... 10 2015 119 455

(51) Int. Cl.
*H01J 29/98*    (2006.01)

(52) U.S. Cl.
CPC .................... *H01J 29/98* (2013.01)

(58) Field of Classification Search
CPC .. H01J 37/241; H01J 37/248; H01J 37/32005; H01J 37/3408; H01J 37/3444; H01J 2237/0206; H01J 2237/2485; H01J 2237/24564; H01J 29/98; H01J 37/24; H01J 2237/06366; H01H 33/60; H05H 7/02; H05H 9/00

USPC ... 315/111.21, 111.81, 291, 342, 94, 111.91; 363/60, 66; 250/492.3, 492.1, 397; 204/192.38, 298.08

See application file for complete search history.

(56) References Cited

U.S. PATENT DOCUMENTS

| | | | |
|---|---|---|---|
| 3,442,252 A | 5/1969 | Ackley | |
| 5,177,402 A | 1/1993 | Howard et al. | |
| 5,347,571 A | * | 9/1994 | Furbee ..................... H05G 1/54 378/101 |

(Continued)

FOREIGN PATENT DOCUMENTS

DE       692 18 166 T2    7/1993

*Primary Examiner* — Haissa Philogene
(74) *Attorney, Agent, or Firm* — Brinks Gilson & Lione

(57) ABSTRACT

An apparatus for suppression of arcs in an electron beam generator including: a first module providing an operating voltage; a second module including a coil suitable for a voltage of at least 10 kV, and at least one free-wheeling diode connected in parallel to the coil; a third module including a first circuit component configured to detect a first actual value for electric voltage, and a first signal is producible when the first actual value falls below a first threshold value, a second circuit component by which a second actual value for electric current is detectable, and a second signal is generated when the second actual value exceeds a second threshold value, a control logic, which optionally links the first and second signals and a resultant output signal is producible; a semiconductor-based switch suitable for the voltage of at least 10 kV, which is opened based on the output signal.

5 Claims, 1 Drawing Sheet

(56) References Cited

U.S. PATENT DOCUMENTS

| | | | |
|---|---|---|---|
| 6,176,979 B1 * | 1/2001 | Signer | C23C 14/32 204/192.12 |
| 7,663,319 B2 * | 2/2010 | Chistyakov | H01J 37/32009 315/111.21 |
| 9,423,442 B2 * | 8/2016 | Henke | G01R 31/02 |
| 2003/0146083 A1 | 8/2003 | Sellers | |
| 2006/0087244 A1 | 4/2006 | Regan | |
| 2008/0067433 A1 | 3/2008 | Weiguo et al. | |
| 2010/0025230 A1 * | 2/2010 | Ehiasarian | H01J 37/32045 204/192.12 |
| 2015/0376532 A1 * | 12/2015 | Hovsepian | C23C 14/165 204/192.15 |

\* cited by examiner

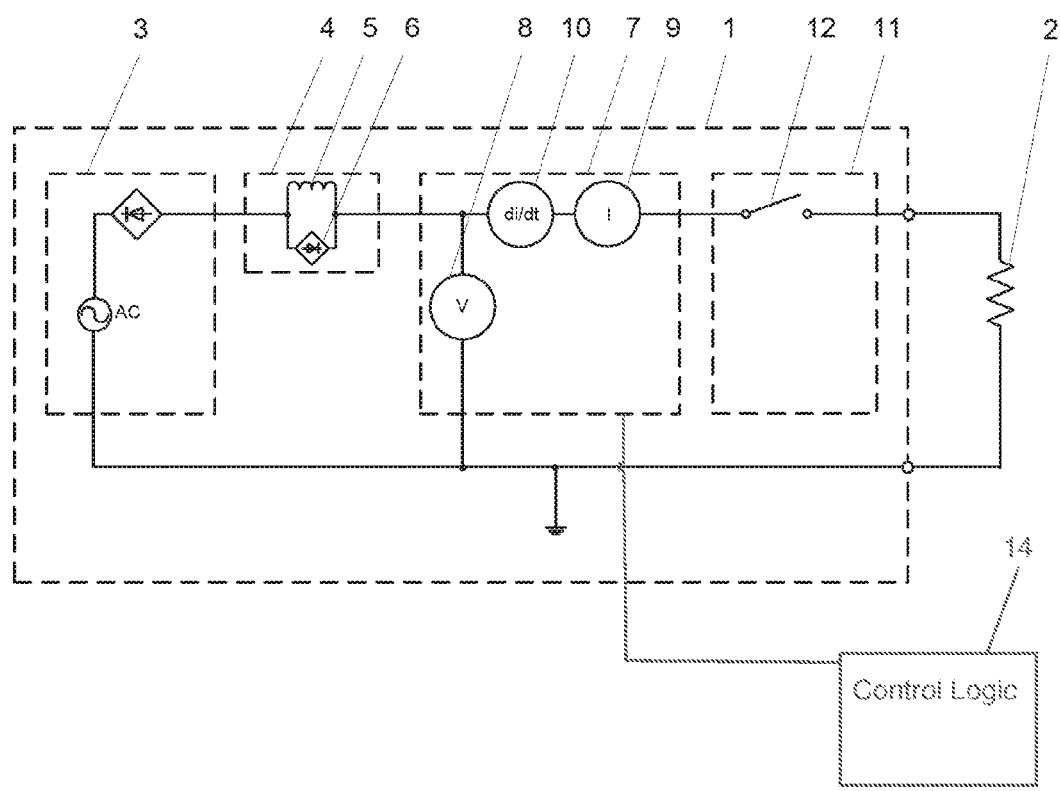

APPARATUS FOR SUPPRESSION OF ARCS IN AN ELECTRON BEAM GENERATOR

CROSS-REFERENCE TO RELATED APPLICATIONS

This application claims priority under 35 USC § 119 to German Patent Application DE 10 2015 119 455.4, filed Nov. 11, 2015, the entire contents of which are hereby incorporated herein by reference.

BACKGROUND

Electron beam generators of different designs have been used for many decades for the implementation of industrial, high-speed PVD methods. Electron-beam vaporizers provide the fastest, industrial-scale, proven coating speeds while delivering excellent uniformity and purity of the deposited layer, and this applies to both reactive and ferromagnetic coating materials as well as to coating materials with a high melting temperature. These characteristics result from a high power flux density, which is adjustable without inertia loss through magnetic focusing and beam control, as well as from the direct heating of a vapor-releasing surface, whereby the crucible needed to hold the coating material can be cooled and thus no contamination of the coating will result.

The electron sources used for industrial PVD processes are presently based exclusively on cathodes heated to a high operating temperature, wherein the generation of free electrons is based on the thermionic effect. The functioning principle of these "thermionic cathodes" means that traditional electron emitters have a complicated design, their power supplies are relatively expensive, and certain embodiments can cover only a highly limited range of technological applications.

One widely used vapor source for vaporization by electron beam is the transversal electron beam generator, wherein the beam generation, the magnetic 270° beam deflection and a crucible with vaporization material are usually integrated in one compact functional unit. These sources are relatively low in cost, but they are limited with respect to their maximum radiation power (approximately 20 kW) and their acceleration voltage (approximately 20 kV). As a result, these sources also are limited with respect to the producible vaporization rate. In addition, the actual radiation source (cathode and heating) is located at the pressure level of a respective coating chamber and is thus exposed directly to the vapors and gases found therein. Consequently, the pressure in the coating chamber must be kept to low values by a correspondingly generous dimensioning of the vacuum pumps in order to prevent instabilities during operation of the electron source. In high-speed deposition of dielectric compounds which require a reactive process control, that is, the setting of a relatively high partial pressure (0.1 to 1 Pa) of reactive gases in the vacuum chamber to ensure the necessary stoichiometry, transversal electron beam generators have not ultimately proven useful in spite of numerous improvements in their design and circuitry. In particular, transversal electron beam generators have not proven useful due to their great tendency toward high voltage arcing, which is unacceptable under these process conditions.

A technologically higher-performance beam generator for vaporizing with electron beams are so-called axial electron beam sources, which are designed for vaporization methods with beam powers up to 300 kW and acceleration voltages up to 60 kV. The cathode chamber of these beam sources is evacuated through apertures with small, usually circular openings for the passage of the beam. The apertures function as a flow resistance to the vacuum. The cathode chamber is separate from the process chamber and is separately evacuated with additional high-vacuum pumps. In the present embodiment, this evacuation is accomplished by means of turbomolecular pumps. Thus the vaporization process can also be operated even at higher pressures, and in particular, also with a large proportion of reactive gases in the coating chamber. In addition, greater coating rates can be attained without any loss of stability. However, systems of this kind are quite expensive with respect to their capital investment costs, and thus for economic reasons can be used profitably only in a narrow range of applications.

In order to overcome this limitation, various cold cathode beam sources with plasma anodes have been developed, wherein the liberation of electrons is not based on the thermionic effect, but rather on the firing of ions from a large-area metal electrode. A high-voltage glow discharge maintained in the beam source produces ions and accelerates them to the cathode. The electrons ballistically transferred from the solid body into the vacuum are accelerated in the fall to the cathode through the plasma, and due to suitable electrode contours, are shaped into a homocentric beam which can be focused by conventional electron-optical subassemblies and deflected to the evaporator.

Whereas thermionic emitters require a high vacuum of better than $10^{-3}$ Pa in the cathode chamber, the operating pressure of the cold cathode is in the range of 2 to 5 Pa. Therefore a differential evacuation of the beam source up to a pressure of about 1 Pa in the coating chamber can be omitted. The control of beam power is effected here by variation of the plasma density in the cathode chamber by a fast gas flow control. Instead of the usual multi-conductor high-voltage power supply, a unipolar high-voltage supply suffices, and the high-voltage power supply does not require any additional floating power supply at high electric potential. As one important financial benefit, it is emphasized that systems designed on the basis of cold cathode emitters—comprising the beam source including its power supply and control components—can be produced at significantly lower costs compared to conventional axial emitter systems.

The described cold cathode axial emitters thus feature many advantages over conventional thermionic emitters, yet still exhibit some shortcomings in certain technical parameters or for particular applications. The competing requirements for reduction in field intensity for the cathode (requires the greatest possible electrode spacing) and reliable dark field shielding (requires the smallest possible electrode spacing) make it increasingly difficult for plasma-based beam sources with increasing operating pressure to maintain the high acceleration voltages in a stable manner over a long term. Previously the operating voltages of around 30 kV prevailing in the high-power range with cold cathode emitters have been sufficient for high-vacuum coating processes, such as, for example, metal coating (0.001 to 0.01 Pa). But voltages in the range of 40 to 60 kV would be more expedient for reactive, high-speed coating processes with typically far greater pressure in the process chamber (0.1 to 1 Pa), due to the better energy transport capacity of the beam.

One important disadvantage of plasma-based electron beam generators is the frequent transition of the glow discharge into an arc discharge. This electric arc in most cases is not extinguished automatically. Due to a number of improvements in technical operation and in source design, the arc rate can be reduced to a value which is compatible at least for selected processes, and some improvements require a considerable, additional outlay of financial resources or for process control. Nonetheless, the arc rates achieved are still too high for many processes.

In order to benefit from the economic advantages of plasma-based beam generators, without the undesirable restrictions on their range of potential applications, a power supply with fast arc handling is required.

The process of arc handling is similar in most power supplies and largely follows the following outline: an arc is detected (arc detection time) and if necessary, a short time (feed time) is intentionally allowed, in order to burn off any possible flakes from the cathode. Next, the energy supply is interrupted for a certain recovery time by switching off the power supply. During this time, the arc is extinguished and the supply voltage can be switched on again. After switch-on, the power supply needs a little time to build up to operating voltage again. The sum of the individual time periods results in the latency time for the process, since the beam generation is interrupted in these phases. Some power supplies additionally limit the current until the arc is extinguished. Power limiting and fast extinction of the arc are used to protect the beam source and ensure its long-term stability.

In selected processes—meaning here in particular the field of high-speed coating, for example of packaging foil—a latency time in the range of microseconds is needed for a reliable prevention of arc-induced defects in the product, such as for example, insufficient coating thickness. Power supplies with fast arc handling in the millisecond range can only be employed in a financially reasonable manner for a limited power range, and are based on medium-frequency technology. Thus these power supplies are too expensive for power outputs greater than 60 kW, and are generally replaced by controlled thyristor controllers. They operate on the existing mains frequency of 50 Hz. The power supply in the case of thyristor controllers can only be switched off by an ignition lock of the thyristors, since thyristors can only be switched on, but cannot be switched off. Therefore the energy supply can only be interrupted after the natural zero transit of the primary alternating voltage. In a 6-pulse rectifier, in the worst case the interruption can occur only after 3.33 ms. In addition, with a thyristor controller, the output capacitance is several times greater in comparison to medium frequency technology because the undulating output voltage requires a greater smoothing. Therefore, in the event of an arc, the entire energy of this capacitance must be discharged into the arc, which can result in an extreme power surge and damage to the power supply.

No solutions are known for operation of the electron beam sources names above, with power outputs greater than 60 kW with a latency time of arc suppression in the range of approximately 100 µs.

BRIEF DESCRIPTION OF THE DRAWINGS

FIG. 1 illustrates a schematic representation of the essential components which can be used to implement the described apparatus.

DETAILED DESCRIPTION

The invention relates to an apparatus which allows a fast detection and extinguishing of arcs in electron beam generators.

Therefore the invention is based on the technical problem of providing an apparatus with which the disadvantages from the prior art can be overcome. In particular, with the apparatus according to this invention, it should be possible to switch off the supply of power when an arc is detected, even for an electron beam generator with a power output greater than 60 kW, within a time of about 100 ns, wherein a latency time of as little as 100 µs for arc suppression is attained.

The invention will be explained in greater detail below with reference to an exemplary embodiment. FIG. 1 illustrates a schematic representation of the essential components of an apparatus 1 according to the invention, by which an electrical voltage to power an electron beam generator 2 can be switched on and off.

The apparatus 1 is composed of four subassemblies. A high-voltage DC power supply is provided for the electron beam generator 2 by using a first module 3 designed as a power supply. Power supplies of this kind are known from the prior art. A second module 4 includes an electric coil 5 suitable for a voltage of at least 10 kV, and also at least one free-wheeling diode 6 connected in parallel to the coil 5. In an additional embodiment, the coil 5 is designed as an air-cored coil, that is, a coil with no core.

Instead of only one free-wheeling diode 6, alternatively, a free-wheeling diode module can be connected in parallel to the coil 5.

A third module 7 is used for arc detection. This module 7 includes a first circuit component 8, with which a first actual value for the electric voltage is detectable and a first signal is producible when the first, actual value falls below a first threshold value. The module 7 further comprises a second circuit component 9 with which a second actual value for the electric current is detectable, and a second signal is producible when the second actual value exceeds a second threshold value. The first and second signals are supplied to a control logic 14 by which the first and second signals are optionally linkable together and a resultant output signal is producible. This means that the control logic will decide whether an arc is detected given the presence of the first signal and/or given the presence of the second signal.

In one embodiment, the third module 7 also includes a third circuit component 10, by which a third actual value for the rate of power rise is detectable, and a third signal is producible when the third actual value exceeds a third threshold value. In this embodiment, using the control logic, the first, second and third signals can be optionally connectable together and thus an output signal can be generated as a function of the first, second and/or third signal.

Furthermore, the apparatus 1 comprises as its fourth module 11, a semiconductor-based switch 12, which is suitable for the high voltage of at least 10 kV, and which is opened when an output signal is generated by module 7 and therefore, an arc has been detected. By opening the switch 12, the power supply to the electron beam generator 2 is interrupted and, therefore, the arc is extinguished. After an adjustable time, the switch 12 is closed again.

Using the inventive apparatus 1, it is possible to reduce the latency time for suppression of an arc to 100 µs. The semiconductor-based switch 12 is an essential component for this. Semiconductor-based switches are distinguished by a very short switching time.

Preferably a MOSFET high-voltage switch will be used as semiconductor-based switch 12. MOSFET high-voltage switches are commercially available for all voltages (10 kV to 90 kV) and currents (2 A to 15 A) to be handled by an electron beam generator. MOSFET switches are characterized by an extremely short switching time in the range of 100 ns.

The module 7 of the apparatus 1 according to this invention makes it possible to detect a high-voltage arc within 300 ns. Various methods and components are known for detection of arcs as a function of the voltage, the current, or the rate of rise in current.

In an apparatus according to the invention, an arc is detected as a function of the electric voltage, that is, using circuit component 8, due to a voltage collapse in the high-voltage circuit. In this case, preferably the voltage collapse is measured using a compensating voltage splitter and is compared to the first threshold value in a comparator.

Measurement of the power rise using circuit component 10 can be effected, for example, by using power surge measuring coils or by Hall effect sensors. Here too, the measured value is compared to a threshold value, in this case, to the third threshold value. The comparator signals can be transferred, for example, galvanically separated over lightwave guides to the control logic.

An additional, important element of apparatus 1 is the coil 5 which is installed in series directly before the switch 12. This item will ensure a more gentle power increase in case of an arc. In this way the arc detection using module 7 and the switch 12 will have more time available until switch-off of the arc occurs. In known devices for arc suppression, the current is limited using serial resistors. This kind of power limiting will not be used in an apparatus according to this invention, since the rated power would be comparatively very high. In this case the power loss would be several kilowatts in the limiting resistors. The advantage of coil 5 is that its ohmic resistance is very low and thus very little power loss will occur. Due to the limiting of the current increase, the current reaches its permissible, maximum value after just a few microseconds. Due to the fast arc detection using module 7 and the fast switch 12, it is however possible to interrupt the power circuit after no more than 1 µs. In this manner a favorable, low-loss opportunity is obtained for power limiting in case of an arc, with a very fast-occurring disconnect of the electron beam generator 2, connected as load, from the high-voltage generator 3. Due to disconnect of the load, the energy supply for the arc is suddenly interrupted. The arc needs a little time to extinguish. The available, free load carriers in the plasma channel of the arc are recombined and the discharge path is solidified. After an adjustable recovery time, the supply power can again be switched on using switch 12, a glow discharge is again ignited and the electron beam generated by the electron beam generator 2 will build up again.

Due to the sudden load disconnect due to opening of switch 12, there will be a voltage increase to switch 12 for the following reasons. First, the power flow through coil 5 will be suddenly interrupted. But this coil 5 still tries to drive the current. Due to self-induction, an extreme over-voltage on the coil 5 is produced. Thus the requirement arises for an additional element of module 4. The free-wheeling diode 6 is thus installed in parallel to coil 5. The free-wheeling diode 6 makes it possible that the current can continue to flow through the coil 5, even when the switch 12 is opened. The second reason for a voltage increase to switch 12 is the energy which is still being transported from the high-voltage generator 3 to the switch 12. The high-voltage generator 3 has too great inertia to detect the load drop. Thus the normal, rated current still flows from the high-voltage generator 3 to the switch 12. But since this voltage cannot flow off from switch 12, the voltage to switch 12 increases. Therefore it is necessary to close the switch 12 again as quickly as possible. In order to prevent an over-voltage to switch 12 under all circumstances, two additional over-voltage protection modules can also be installed. One over-voltage module directs the over-voltage to ground, for example, and the other over-voltage module can be connected in parallel with the switch 12. As additional protection of the switch 12 against over-voltage, a free-wheeling diode can also be connected in parallel to switch 12.

In a favorable manner the coil 5 causes the module 4 to operate like a power supply. After extinction of an arc, if the switch 12 is switched on again before the coil 5 has fully converted its energy into heat, the flyback current is commutated back into the load circuit. Thus a fast re-ignition of the glow discharge can be obtained.

We claim:

1. An apparatus for suppression of arcs in an electron beam generator, comprising the following components connected in series:
   a) a first module for providing of an operating voltage;
   b) a second module comprising a coil suitable for a voltage of at least 10 kV, and also at least one free-wheeling diode connected in parallel to the coil;
   c) a third module for arc detection, comprising
      a first circuit component with which a first actual value for an electric voltage is detectable, and a first signal is producible when the first actual value falls below a first threshold value,
      a second circuit component with which a second actual value for an electric current is detectable, and a second signal is producible when the second actual value exceeds a second threshold value,
      a control logic with which the first and second signals are linkable together and a resultant output signal is producible;
   d) a semiconductor-based switch suitable for the high voltage of at least 10 kV, which is opened with the generation of the output signal.

2. The apparatus of claim 1, wherein the coil in the second module is designed as an air-cored coil.

3. The apparatus of claim 1, wherein a free-wheeling diode module is connected in parallel to the coil in the second module.

4. The apparatus of claim 1, wherein the switch is designed as a MOSFET switch.

5. The apparatus of claim 1, wherein the third module comprises a third circuit component, with which a third actual value for a rate of power rise is detectable, and a third signal is producible when the third actual value exceeds a third threshold value, and wherein the first, second and third signals are linkable together using the control logic.

* * * * *